United States Patent [19]

Nath et al.

[11] Patent Number: 4,729,970
[45] Date of Patent: Mar. 8, 1988

[54] CONVERSION PROCESS FOR PASSIVATING SHORT CIRCUIT CURRENT PATHS IN SEMICONDUCTOR DEVICES

[75] Inventors: Prem Nath, Rochester; Craig Vogeli, New Baltimore, both of Mich.

[73] Assignee: Energy Conversion Devices, Inc., Troy, Mich.

[21] Appl. No.: 907,425

[22] Filed: Sep. 15, 1986

[51] Int. Cl.$^4$ .................. H01L 21/306; H01L 31/18
[52] U.S. Cl. ........................................ 437/225; 437/4; 437/170; 437/923; 437/939; 136/258; 136/290; 204/130; 204/140
[58] Field of Search ............ 437/2, 4, 5, 10, 12, 437/170, 171, 181; 225/233, 235, 923, 939; 136/258 AM, 290; 204/130, 140, 15

[56] References Cited

U.S. PATENT DOCUMENTS 4,640,002  2/1987  Phillips et al. ...................... 29/574

FOREIGN PATENT DOCUMENTS 60-85576  5/1985  Japan ................................. 136/290
60-85578  5/1985  Japan ................................. 136/290

*Primary Examiner*—Aaron Weisstuch
*Attorney, Agent, or Firm*—Marvin S. Siskind; Richard M. Goldman

[57] ABSTRACT

An electronic device of the type including a thin film body having a superposed electrode has short circuit defects therein passivated by a conversion process in which the electrical resistivity of the electrode material is increased proximate the defect regions. Conversion is accomplished by exposing the electrode material to a conversion reagent and activating the reagent proximate the defect regions. The process may be utilized for a variety of differently configured devices, and may be readily adapted for use in a roll-to-roll device fabrication process.

17 Claims, 10 Drawing Figures

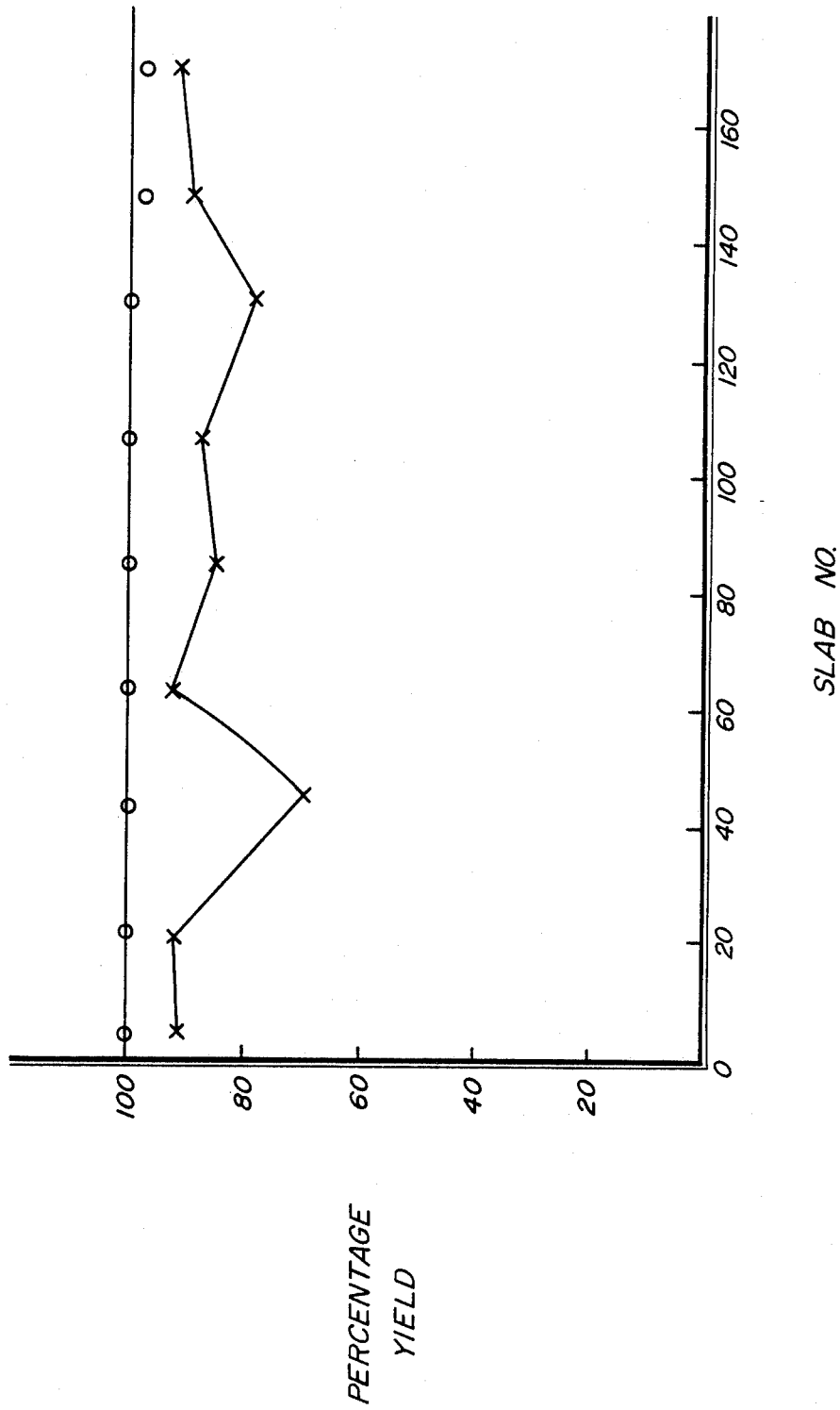

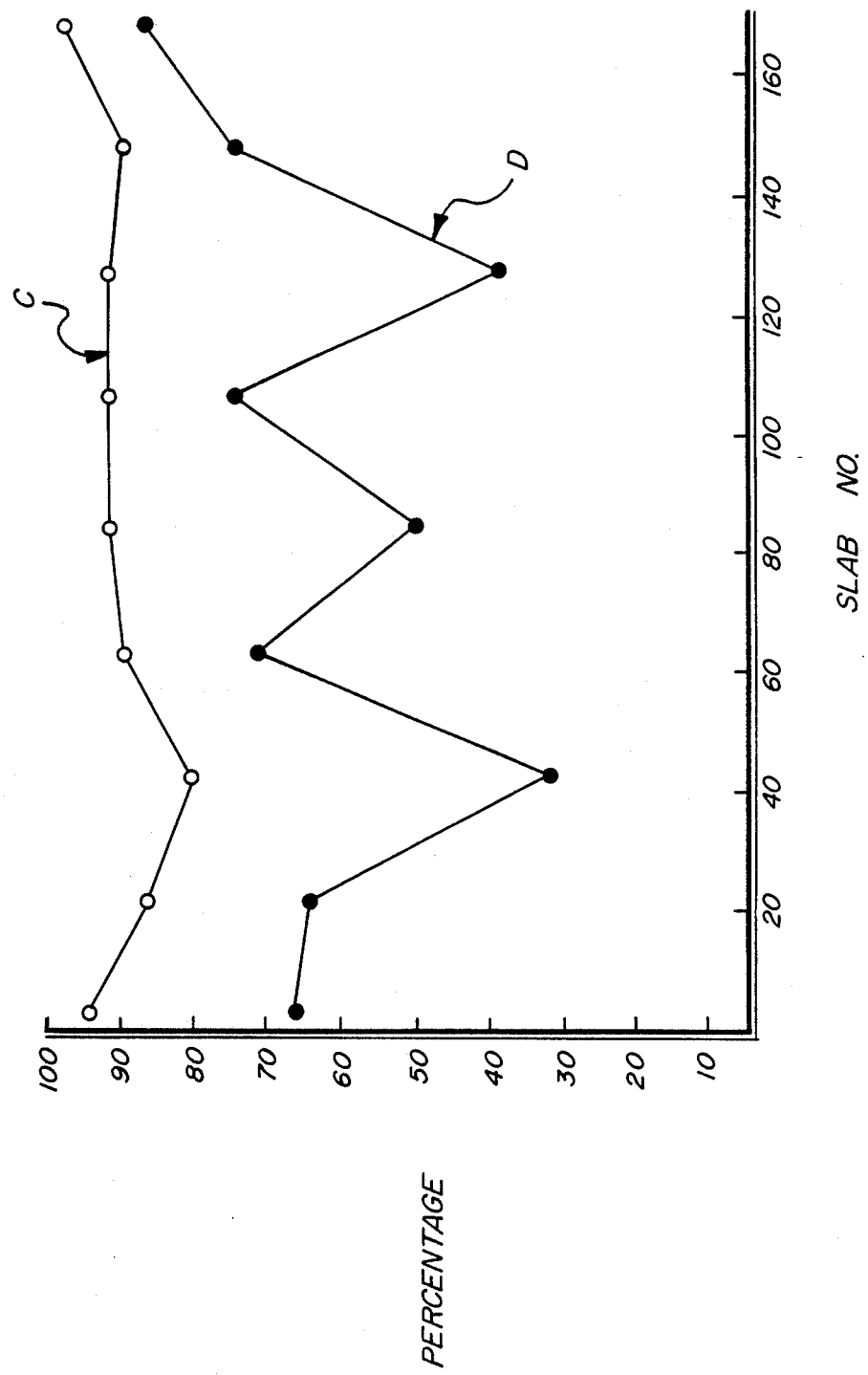

CONVERSION PROCESS FOR PASSIVATING SHORT CIRCUIT CURRENT PATHS IN SEMICONDUCTOR DEVICES

FIELD OF THE INVENTION

This invention relates generally to electronic devices, and particularly to a process for passivating or isolating short circuit current paths which form therein, as well as to devices having defects therein passivated. The invention is most particularly adapted for use in making large area, thin film electronic devices such as capacitors, photovoltaic devices, photodetector arrays, diode arrays, large area optical displays, as well as arrays of memory devices.

BACKGROUND OF THE INVENTION

The instant invention provides a method for eliminating or substantially reducing the effects of short circuit defects in electronic devices of the type which include a thin film body of semiconductor alloy, or dielectric material having a layer of high electrical conductivity electrode material disposed thereatop. As such, the instant invention is particularly adapted for use in the fabrication of capacitors as well as large area, thin film semiconductor devices.

Single crystal semiconductor devices have been utilized for some time as photovoltaic sources of power, current control devices, photosensor elements, memory elements and the like. However, the utility of such devices is limited by problems associated with the manufacture thereof. More particularly, single crystalline materials (1) are difficult to produce in sizes substantially larger than several inches in diameter, (2) are thicker and heavier than their thin film counterparts; and (3) are expensive and time consuming to fabricate.

Recently, considerable progress has been made in developing processes for depositing thin film semiconductor materials. Such materials can be deposited to cover relatively large areas and can be doped to form p-type and n-type semiconductor materials for the production of semiconductor devices, such as p-i-n type photovoltaic cells, equivalent, and in some cases superior to those produced by their crystalline counterparts. One particularly promising group of thin film materials are the amorphous materials. As used herein, the term "amorphous" includes all materials or alloys which have long range disorder, although they may have short or intermediate range order, or even contain at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap, and absorption constant occur.

It is now possible to prepare by glow discharge, or other vapor deposition processes, thin film amorphous silicon, germanium or silicon-germanium alloys in large areas, said alloys possessing low concentrations of localized states in the energy gaps thereof and high quality electronic properties. Suitable techniques for the preparation of such alloys are fully described in U.S. Pat. Nos. 4,226,898 and 4,217,374 of Stanford R. Ovshinsky, et al., both of which are entitled "Amorphous Semiconductor Equivalent To Crystalline Semiconductors" and in U.S. Pat. Nos. 4,504,518 and 4,517,223 of Stanford R. Ovshinsky, et al. both of which are entitled "Method Of Making Amorphous Semiconductor Alloys And Devices Using Microwave Energy"; the disclosures of all of the foregoing patents are incorporated herein by reference.

It is of obvious commercial importance to be able to mass produce semiconductor devices such as, for example, photovoltaic cells in large areas. However, with crystalline semiconductor materials mass production was limited to batch processing techniques by the inherent growth requirements of the crystals. Unlike crystalline silicon, amorphous alloy materials can be deposited in multiple layers over large area substrates to form solar cells and the like in a high volume, continuous processing system. Such continuous processing systems are disclosed in the following U.S. Pat. No. 4,400,409 for "A Method Of Making P-Doped Silicon Films And Devices Made Therefrom"; U.S. Pat. No. 4,410,588 for "Continuous Amorphous Solar Cell Deposition And Isolation System And Method"; U.S. Pat. No. 4,542,711 for "Continuous System For Depositing Amorphous Semiconductor Material"; U.S. Pat. No. 4,492,181 for "Method And Apparatus For Continuously Producing Tandem Amorphous Photovoltaic Cells"; and U.S. Pat. No. 4,485,125 for "Method And Apparatus For Continuously Producing Tandem Amorphous Photovoltaic Cells". As detailed in these patents, the disclosures of which are incorporated herein by reference, a substrate may be continuously advanced through a succession of deposition chambers, wherein each chamber is dedicated to the deposition of a specific semiconductor material. For example, in the manufacture of solar cell of p-i-n configuration, the first chamber of an apparatus is dedicated for the deposition of a p-type alloy material, the second chamber is dedicated for the deposition of an intrinsic alloy material, and the third chamber is dedicated for the deposition of an n-type alloy material. Obviously, by utilizing additional chambers or other configurations of chambers, various other semiconductor devices may be similarly manufactured.

As is obvious from the foregoing, thin film semiconductor materials offer several distinct advantages over crystalline materials, insofar as they can be easily and economically fabricated into a variety of devices by newly developed mass production processes. However, in the fabrication of semiconductor materials and devices by the aforementioned processes, the presence of current-shunting, short circuit defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition or subsequent processing of the semiconductor layers. It is to the end of eliminating, or at least substantially reducing the effects of these current-shunting defects to which the instant invention is directed.

The most important of these defects may be characterized as shunts, short-circuits, defect regions or low resistance current paths, such terms being employed interchangeably herein. Before the suspected causes of these defects are explained, it is helpful to note the thicknesses of the deposited semiconductor layers. In a p-i-n type photovoltaic device, a typical "p" layer may be only on the order of 250 angstroms thick, a typical "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however small, are not easy to cover by the deposited semiconductor layers.

Shunt defects are present when one or more low resistance current paths develop through the semiconductor body of the device, allowing current to pass unimpeded between the electrodes thereof. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "burn out" the device.

While shunt-type defects always deleteriously affect the performance of photovoltaic devices, their effect is greatest when the devices in which they are incorporated are operated under relatively low illumination, such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect regions), whereas under AM-1 illumination, the load resistance is much lower by comparison. Furthermore, in a photovoltaic device, photogenerated current increases linearly with increasing illumination, while the resulting voltage increases exponentially. In other words, voltage attains a relatively high value under low illumination, the value increasing only slightly as the intensity of the illumination is increased. The result is that under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while more power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein a photovoltaic or other semiconductor device, initially exhibiting satisfactory electrical performance, suddenly fails. The failures will be referred to in this application as operational mode failures regardless of whether the device was previously connected to a load for the generation of power, it only being necessary that the device was, at some time, subjected to illumination, thereby initiating the generation of carriers or otherwise subjected to the flow of current therethrough. This type of failure will be discussed in further detail hereinbelow. It is believed the shunt defects, both latent and patent, arise from one or more irregularities in the (1) morphology of the substrate material, or (2) in the growth of the semiconductor layers.

The first, and perhaps most important, source of the defects, i.e., the aforementioned morphological irregularities in the deposition surface of the substrate material will now be discussed. Even though the highest quality stainless steel is employed to serve as the substrate or base electrode upon which the semiconductor layers are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, such defects may establish a low resistance current path through the semiconductor body, thereby effectively short-circuiting the two electrodes. This may occur in numerous ways. For instance, a spike projecting from the surface of the substrate electrode may be of too great a height to be covered by the subsequent deposition of semiconductor layers and therefore, be in direct electrical contact with the other electrode when that electrode is deposited atop the semiconductor layers. Likewise, a crater formed in the surface of the substrate electrode may be of too small a size to be filled by the subsequent deposition of semiconductor layers and therefore, be in sufficient proximity to the other electrode, when that electrode is deposited atop the semiconductor layers. In such an instance; (1) electrical current may bridge the gap which exists between the electrodes, or (2) during actual use (e.g., the photoinduced generation of electrical current) of the semiconductor device, the material of one of the electrodes may, under the influence of the electrical field, migrate toward and contact the other of the electrodes, so as to pass electrical current therebetween and thereby give rise to an operational mode failure. It is also possible that in some cases the semiconductor layers deposited onto the substrate include regions of irregular composition which can provide low resistance paths for the flow of electrical current between the electrodes of the photovoltaic device.

Further, despite efforts to maintain the vacuum envelope free of external contaminants, dust or other particulate matter which either (1) invades the vacuum envelope during the deposition of the semiconductor material, or (2) forms as a by-product of the deposition process, may be deposited over the substrate electrode along with the semiconductor material. Such contaminants interfere with the uniform deposition of the semiconductor layers and may establish low resistance current paths therethrough.

Additionally, it is suspected that in some cases, the semiconductor material may form micro-craters or micro-projections during the deposition thereof, even absent the presence of contaminants or external pollutants. Such morphological deviation from a perfectly smooth and even surface means that the substrate is covered by semiconductor material either (1) in an "ultra thin layer" (consider again that the total thickness of all semiconductor layers is only on the order of 4,000 angstroms and any reduction in coverage is indeed an ultra thin layer) or (2) not at all. Obviously, when the upper electrode material is deposited across the entire surface of the semiconductor body, the thin or open regions thereof create a low resistance current path. In still other cases, the presence of defect regions is only detectable by their deleterious effect upon the electrical and/or photoelectric properties of the resultant device.

In some instances, particular semiconductor devices may operate adequately in spite of the presence of such defects; however, other devices, such as photovoltaic devices are significantly impaired in function by defects therein. While the defects described hereinabove may, in some instances, not be sufficiently severe to divert all electrical current through the low resistance path, the diversion or shunting of any current therethrough results in some loss in operational efficiency of the photovoltaic device. Moreover, the shunting of even small amounts of current through each of thousands of defect regions will aggregate to cause major losses in efficiency. Based upon the foregoing, it should be apparent that a reduction in current flow through defect regions is critical to the fabrication of high-yield, high efficiency, large area, thin film photovoltaic devices.

Several approaches for dealing with this problem have been implemented by the assignee of the instant invention. As described in U.S. Pat. No. 4,451,970, 4,464,823, 4,510,674, and 4,510,675 of Masatsugu Izu and Vincent Cannella, the disclosures of which are incorporated herein by reference, the shunting of current through defect regions is cured by substantially eliminating the defect regions as an operative area of the semiconductor device. This is accomplished in an electrolytic process wherein electrode material (in the preferred embodiment, indium tin oxide) is removed from the periphery of the defect site, effectively isolating the defect regions and preventing the flow of electrical current from the defect region into the electrode layer. As disclosed in U.S. Pat. No. 4,385,971 of Swartz, defect regions in a solar cell are electrolytically removed in a process which either etches, or bubble-blasts defective semiconductor regions from the solar cell, so as to physically remove material therefrom. However, in those instances where a current collecting structure such as a busbar system or a grid pattern is subsequently applied to the device, care must be taken in utilizing the aforedescribed processes so as to avoid having such donductive structure electrically contact the isolated defect, to avoid creating another short circuit. Consequently, insulating material is generally applied to the isolated regions.

In U.S. Pat. No. 4,419,530 of Prem Nath, entitled "Improved Solar Cell And Method For Producing Same", and assigned to the assignee of the instant patent application, the disclosure of which is also incorporated herein by reference; there is described a method for electrically isolating defect containing small area segments of an amorphous, thin film, large area photovoltaic device. This isolation of defects is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed.

While the method of Nath is effective in reducing or eliminating the effect of defects, it is not completely satisfactory for several reasons. The step of dividing the semiconductor body of the solar cell into electrically isolated portions requires several production steps and also reduces the total area of the solar cell that is available for producing electrical energy. Further, the method can be time and cost intensive since the electrical output of each isolated portion must be tested and separate electrical connections must be made to provide electrical contact thereto. Also, since an entire segment is effectively eliminated from the final cell if it manifests a defect, losses of efficiency are greater than they would be if only the precise area of the particular defect were eliminated.

U.S. Pat. No. 4,598,306 of Nath, et al. entitled "Barrier Layer for Photovoltaic Devices", the disclosure of which is incorporated herein by reference, discloses the use of a resistive barrier layer interposed between the semiconductor body and one of the electrodes of a semiconductor device for limiting the amount of electrical current that can flow through defect regions. In this manner, the relatively large short circuit current flowing through defect regions is buffered by the current limiting resistance of the layer. While the foregoing method does improve the production yield of usable semiconductor devices, it interposes an additional series resistance therein, which resistance decreases the operational efficiency of the the device.

U.S. Pat. Nos. 4,590,317 and 4,633,033 of Nath, et al., both entitled "Photovoltaic Device And Method", the disclosures of which are incorporated herein, teach the use of various current collecting bus grid structures for the purpose of restricting short circuit current flow in semiconductor devices. According to the teachings therein, the current carrying capacity of grid systems of devices may be effectively restricted through the use of proper geometry, and/or materials. The limited current carrying capacity of such current collecting grids functions to buffer the effects of short circuit current flows through defect regions proximate thereto. While this system does significantly improve device yield, it obviously is of no use for semiconductor devices which do not include a current collecting grid structure therein; additionally, such grid structures, themselves, add some additional series resistance to the device.

It can be seen from the foregoing that defect regions in thin film electronic devices is a significant problem as is witnessed by the fact that a number of solutions thereto have been proposed by the prior art; however, all of the foregoing prior art solutions suffer from various inadequacies which make them inapplicable in a number of thin film semiconductor devices. For instance, some of the solutions add significant series resistance to devices in which they are incorporated, while other of the solutions can only be used in semiconductor devices which incorporate current collecting grid systems therein.

It accordingly should be apparent that there is a still a need for a method of eliminating or correcting short circuit defects in thin film electronic devices, which method will not add significant series resistance thereto and which may be implemented in a wide variety of devices. As will be apparent from the drawings and detailed description which follows, the instant invention provides for an improved thin film semiconductor device having the defects therein "cured" as well as a method for effecting that cure.

BRIEF DESCRIPTION OF THE INVENTION

There is disclosed herein a method of passivating short circuit defects in an electronic device of the type which includes a thin film body with a superposed electrode comprised of a layer of electrically conductive material. According to the method, a conversion reagent, adapted to convert the electrically conductive electrode material to a material of a higher electrical resistivity, is provided in contact with at least those portions of the electrode proximate defects. Then the conversion reagent is activated proximate the defects so as to facilitate the conversion reaction. In this manner, the defect regions are substantially electrically isolated from the remainder of the electrode.

In one embodiment of the instant invention, the electrode is formed of a transparent conductive oxide material and the conversion reagent alters the stoichiometry of the transparent conductive oxide material so as to increase its electrical resistivity. The alteration of the stoichiometry may, in some cases, include changing the number of oxygen vacancies in the oxide material. Such change in the number of oxygen vacancies may be accomplished by utilizing either an oxidizing or a reducing conversion reagent. In other embodiments, the electrode is a metal and the conversion reagent converts the method to an insulating form such as an oxide, nitride, carbide, or the like.

In another embodiment, the conversion reagent is activated by passing electrical current through at least the defect regions of the thin film body and into the superposed electrode so as to activate the reagent proximate thereto. Such electrical activation may be accomplished by providing a source of electrical current in communication with both the thin film body and a counter electrode maintained in electrical communication with the conversion reagent. In other instances, the conversion reagent may be activated by heating or illumination.

The conversion reagent may in some instances, include therein a Lewis acid such as a salt of an amphoteric element. Among some salts having particular utility are $AlCl_3$, $ZnCl_2$, $SnCl_2$, $SnCl_4$, $TiCl_4$, and combinations thereof. The conversion reagent may be an aqueous solution or may include a non-aqueous solvent.

The method of the instant invention may also be utilized to passivate latent short circuit defects, in which instance the method includes the further step of activating the latent defects so as to convert them to actual short circuit defects which are then passivated. Activation may include passing an electrical current through the latent defects. In some instances activation may be accomplished prior to the activation of the conversion reagent and subsequent passivation or in other instances the latent defect may be activated concomitant with the activation of the conversion reagent.

The instant invention also includes devices having defect regions therein passivated. Such devices include a thin film body with a superposed electrode comprised of electrically conductive material. The devices also include at least one defect region in the semiconductor layer thereof which establishes a low resistance current path therethrough in electrical communication with the superposed electrode. The electrode of such devices include a high resistivity portion therein proximate the low resistance current paths formed by the defect and in this manner the low resistance path of the defect is substantially, electrically isolated from the remainder of the electrode layer so as to minimize the effect thereof upon the electrical performance of the device. Among some of the materials which may be utilized for the electrode are transparent conductive oxide materials such as tin oxide, indium oxide, indium tin oxide, zinc oxide, cadmium stannate, and combinations thereof.

The thin film material may be chosen from a wide variety of semiconductor materials. Among some of the materials which may be utilized are silicon alloys, germanium alloys, and silicon-germanium alloys. The device may be a capacitor, a photovoltaic device, a photosensor device, a diode or other such semiconductor devices, as well as arrays thereof.

The instant invention may be adapted to the manufacture of large area semiconductor devices comprised of a plurality of electrically interconnected small area segments disposed upon a supporting substrate. Each of the small area segments includes a body of semiconductor material having a superposed electrode comprised of a layer of electrically conductive material. The semiconductor body of at least one of the segments includes a defect region therein which establishes a low resistance current path therethrough and in electrical communication with the superposed electrode. The electrode includes a high resistivity portion proximate said low resistance path. In this manner the low resistance path is substantially electrically isolated from the remainder of the electrode layer so as to minimize its effect upon the total electrical performance of the large area device. Such large area devices may include monolithic photovoltaic devices or photosensor arrays.

BRIEF DESCRIPTION OF THE DRAWINGS

FIG. 6A is a graphic representation of the yield (Graph A) of photovoltaic devices as measured under AM-1 illumination, obtained through the use of the instant invention, as compared to the yield (Graph B) without the instant invention;

FIG. 6B is a graphic representation of the samples of FIG. 6A, as measured under more severe room light criteria, illustrating the improvement in yield (Graph C) of devices teating as per the instant invention as compared to yield (Graph D) of non-treated devices; and, FIG. 7 is a schematic illustration of an apparatus adapted to passivate defect regions in semiconductor device material disposed upon the elongated web of substrate material, in a roll-to-roll process.

DETAILED DESCRIPTION OF THE DRAWINGS

I. Defects in Semiconductor Devices

Figure 1:
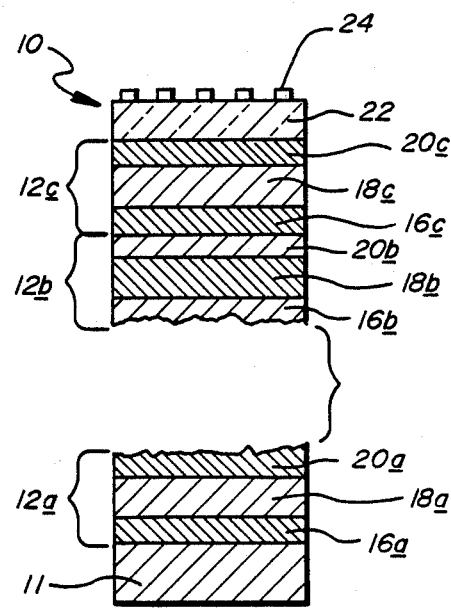
FIG. 1 is a fragmentary cross-sectional view of a tandem photovoltaic device comprised of a plurality of n-i-p type photovoltaic cells.

Referring now to the drawings, wherein like reference numbers designate like structure, and particularly to FIG. 1, a stacked, tandem, or cascade-type photovoltaic device, formed of successive n-i-p layers each including an amorphous semiconductor alloy, is shown generally by the reference numeral 10. The present invention may be employed in conjunction with the fabrication of such photovoltaic cells; however, it is to be understood that the instant invention is not limited to photovoltaic cells or to semiconductor devices of any particular composition or configuration but may be employed to mitigate the effect of defects in any electronic device having a thin film semiconductor or dielectric body and a superposed electrode.

FIG. 1 shows a tandem photovoltaic device 10, which includes a photovoltaic semiconductor body 12 adapted to generate a flow of electrical current in response to the absorption of photons incident thereupon, and consisting of a plurality of n-i-p photovoltaic cells 12a, 12b, and 12c. Below lowermost cell 12a is a substrate 11 which may be a metallic member such as an electrically conductive stainless steel sheet, or a thin metallic foil, or which may be formed from an electrically insulating material such as glass, synthetic polymeric resins and the like, and provided with an electrically conductive coating upon at least a portion thereof.

Although certain applications may require the application of a thin oxide layer and/or a series of base contacts deposited upon the substrate prior to the deposition thereupon of the semiconductor material, for purposes of this application, the term, "substrate" shall also include any elements added thereto by preliminary processing.

As illustrated, each of cells 12a, 12b, and 12c includes a semiconductor body containing at least a silicon alloy. Each of the alloy bodies includes an n-type region or layer (16a, 16b or 16c); an intrinsic region or layer (18a, 18b or 18c); and a p-type region or layer (20a, 20b or 20c). As illustrated, cell 12b is an intermediate cell and, as indicated in FIG. 1, additional intermediate cells may be stacked atop the illustrated cells without departing from the spirit or scope of the present invention. Also, although stacked n-i-p cells are illustrated, this invention is equally adapted for single or stacked p-i-n cells, it being understood that the term "n-i-p type cell" as used herein is meant to include any triad of n, i, and p semiconductor layers operatively disposed to provide a photoactive region for generating charge carriers in response to the absorption of photon energy.

For each of cells 12a, 12b and 12c, the p-type layers are characterized by low light absorption, high conductivity layers of preferably microcrystalline semiconductor alloy material. The intrinsic alloy layers are characterized by an adjusted wavelength threshold for a solar photoresponse, high light absorption, low dark conductivity and high photoconductivity, and may include sufficient amounts of a band gap adjusting element or elements to optimize the band gap for the particular cell application. Preferably, the intrinsic layers are band gap adjusted to provide cell 12a with a lowest band gap, cell 12c with the highest band gap, and cell 12b with a band gap between the other two. The n-type layers are characterized by low light absorption, high conductivity, preferably microcrystalline alloy layers. The thickness of the n-type layers is preferably in the range of about 25 to 500 angstroms. The thickness of the band gap adjusted, amorphous intrinsic alloy layers is preferably between about 2,000 angstroms to 30,000 angstroms. The thickness of the p-type layers is preferably between 25 to 500 angstroms.

The photovoltaic device 10 further includes a layer of transparent electrically conductive material 22, which serves as the top electrode of the photovoltaic device. This layer 22, may be deposited over the semiconductor body 12 in a continuous process, or in a separate environment. In one embodiment, the transparent conductive layer 22 is formed of indium tin oxide, although other transparent conductive materials such as zinc oxide, cadmium stannate, tin oxide, and indium oxide, as well as various mixtures thereof are known to skilled practitioners and may also be suitably employed to form the layer. The photovoltaic device 10 may also include a bus grid pattern 24 formed of a highly conductive material to assist in the collection of photogenerated current. The bus grid pattern is typically formed of a metal such as copper on silver, and aids in collection of photogenerated current.

As discussed previously, problems occur in semiconductor devices when short circuit producing defect regions are present in the semiconductor body, since these defects can divert substantial amounts of current therethrough. The problem is especially significant when the semiconductor device includes a highly conductive electrode member disposed upon the semiconductor body; because in those instances, the electrodes can communicate with the short circuit producing defect and effectively short the entire device therethrough. In the case of photovoltaic devices, such defects can shunt a substantial portion, if not all, of the output photocurrent therethrough thus rendering the device practically inoperative. In photosensor arrays, the presence of such a short circuit defect will degrade signal output of the device. Similar detrimental effects will occur in other devices such as diode arrays, memory devices, integrated circuits and the like.

Figure 2:
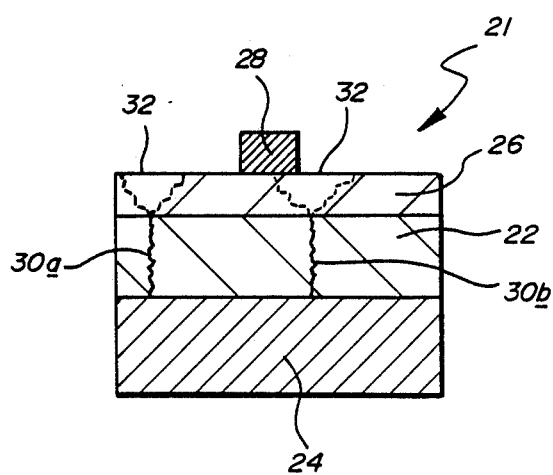
FIG. 2 is a stylized, cross-sectional view of a semiconductor device including two short circuit defect regions therein.

Referring now to FIG. 2, there is shown an electronic device 21 for the purpose of illustrating the types of defects addressed by the instant invention. The device 21 is a stylized depiction of a semiconductor device and it is meant to represent any one of a great number of devices including photovoltaic devices, photosensors, diodes, and the like. The device 21 includes a semiconductor body 22 disposed upon a substrate member 24 which, in this embodiment, forms a base electrode for the device. Included is a top electrode member 26 in superposed relationship with the semiconductor body 22. Also shown is a portion of a current collecting grid member 28 disposed upon the top electrode 26. Illustrated within the semiconductor body 22 are two defect regions 30a, 30b which establish a short circuit current path between the top electrode 26 and the base electrode 24 of the device 21. Although the defect paths 30a, 30b are shown as linear structures passing through the semiconductor body 22, it should be noted that this is for purposes of illustration only and such paths may alternatively be formed by a raised protuberance extending from the substrate electrode 24 and passing through the semiconductor body 22, or they may be formed by pin holes or craters in the semiconductor body 22 which allow material of the top electrode 26 to infiltrate therethrough and establish a low resistance current path to the base electrode 24. It should thus be kept in mind that the illustration of the defect regions 30a, 30b in FIG. 2, and the succeeding Figures, are meant to include all of the foregoing types of defects which establish a short circuit or other low resistivity current paths through a semiconductor device.

Since the defect regions 30a, 30b are in electrical communication with the top electrode 26 of the semiconductor device 21, and since that electrode is formed of a relatively high conductivity material, a large portion of the surface of such a defect containing semiconductor device will be in good electrical communication with, and hence under the influence of, the defect regions. By increasing the electrical resistivity of the top electrode layer 26, the portion of the electrode which will be detrimentally affected by an underlying short circuit defect may be somewhat restricted by the lateral resistivity of that material. However, as previously discussed, this approach does increase series resistivity of a semiconductor device in which it is implemented. As illustrated in FIG. 2, the effect of the defects 30a, 30b may spread beyond the immediate proximity of their contact with the top electrode layer 26 owing to the lateral conductivity therethrough. For purposes of illustration, the area which is in good electrical communication with the defects is indicated by phantom outline regions 32 formed thereabout. It will be noted that one of these regions 32 associated with defect 30b overlaps with the grid member 28 of the device 21, although that defect 30b is somewhat laterally displaced from the grid member 28. In those instances where a grid, bus bar or other highly conductive member is associated relatively closely with a defect region, the effects of that defect are greatly magnified owing to the high conductivity of the member. For example, in the device 21 illustrated, the entirety of the top electrode layer 26 which is in good electrical communications with the grid member 28 will be detrimentally affected by the short circuit defect 30b proximate to that grid member 28. In the case of a photovoltaic cell, a defect occurring near a portion of the grid system thereof can effectively short circuit the entire photovoltaic device through that defect if no further precautions are taken. Such a short circuit would result in catastrophic loss of cell operation. Similar destructive effects can occur in other types of devices when a short circuit defect region is proximate a high conductivity, current carrying structure.

In a similar manner, defects, in thin film layers of other electronic devices, such as capacitors would also be detrimental. For example, capacitors formed by disposing a dielectric body between two highly conductive electrodes. A pinhole in the dielectric, or an irregularity associated with the electrodes can establish a short circuit path rendering the capacitor inoperative. Similar problems will obviously arise with other devices such as threshold switches, photosensors and the like.

II. Passivation of Defects

According to the instant invention, high conductivity defect regions in the semiconductor or dielectric body of a device may be effectively passivated by converting the portion of the conductive electrode material overlying a defect region to a high resistivity material or form thereof. In this manner, the current paths between the high conductivity defect region and the majority of the conductive electrode is terminated. Because conversion of the electrode material takes place only proximate the defects, there is no overall increase in the resistivity of the electrode material, and therefore the overall series resistance of the device is not increased.

There are a wide variety of materials which may be employed to form an electrode of an electronic device. Included among such materials are metals, degenerate semiconductors, and cermets. The particular conversion reagent employed will depend upon the nature of the electrode material, the only requirement being that the conversion reagent be capable of converting the electrode material to a high resistivity form when activated while leaving the remainder of the electrode material relatively unaltered. Conversion of the electrode material may be by oxidation or reduction thereof or other chemical or physical reaction which changes the composition or stoichiometry of the electrode material. For example, a metallic material when anodized or otherwise converted to its oxided, nitrided, carbided, etc. form will generally exhibit a significant increase in electrical resistivity. Similarly, an electrically conductive electrode material may have its conductivity altered by diffusing in or leaching out additional elements.

One particular class of conversion reagents are acidic compounds, in particular Lewis acids. In general, acidic compounds are regarded as being electrophilic reagents, insofar as they tend to accept electrons from materials with which they are reacting. Lewis acids are aprotic acidic compounds, that is to say they do not generate large amounts of hydrogen ions, consequently they are less prone to detrimentally attack electrode materials in the absence of activating energy and for this reason have been found particularly advantageous in the practice of the instant invention. Among some of the Lewis acids having utility are $AlCl_3$, $ZnCl_2$, $SnCl_4$, $SnCl_2$, $TiCl_4$ and various combinations thereof. In general it has been found that salts, particularly halide salts, of amphoteric elements will function as conversion reagents of the Lewis acid type. There are a great variety of such materials known and available to those skilled in the art and a particular reagent may be readily selected therefrom based upon knowledge of the reactions thereof.

One particular group of electrode materials having great utility in the fabrication of many electronic devices are the transparent conductive oxide materials. These electrode materials are utilized to provide one or both of the electrodes in a variety of devices, particularly photoresponsive devices such as photovoltaic cells, and photosensors as well as light emitting devices, liquid crystal displays and the like. Among some of the transparent conductive oxides are indium oxide, tin oxide, indium tin oxide, zinc oxide, cadmium stannate, and various combinations thereof. These oxide materials may be readily converted from a high electrical conductivity form to a high electrical resistivity form by treatment with various reagents in accord with the principles of the instant invention. Applicants believe that for the aforementioned oxide materials to manifest high electrical conductivity, they must contain an appropriate number of oxygen vacancy sites therein, that is, sites deficient in oxygen atoms. It is these sites that provide the appropriate type of defect in the band gap of the oxide materials which contributes to their electrical conductivity. By altering the number of oxygen defect sites the electrical conductivity may be modified; if the number of oxygen vacancies is made too large or too small the materials will lose electrical conductivity.

Activation of the conversion reagent may be accomplished by a variety of energetic inputs, depending upon the particular reagent and processing conditions employed. For example, activation may be achieved by input of light, heat, or electrical energy to the reagent in regions proximate the defects being passivated. If an electrical bias is applied to a semiconductor device including low resistivity defects, electrical current will preferentially flow through the low resistivity defect paths and in this manner, current may be selectively provided to the defect regions by controlling magnitude and/or polarity of the current applied. Similarly, heating may be effected by passage of an electrical current through defect regions and in this manner thermal activation may be selectively achieved. The advantage of such a process is that one need not actually locate the defects in order to passivate them. The process is essentially "self-finding" since the flow of current through the defects activates the conversion reagent proximate thereto.

Photochemical activation may be achieved by illuminating defect regions with a laser or other light source. Such selective illumination will be dependent upon detection of the defect regions via an optical or electrical process. In some instances, semiconductor devices are scribed or severed by the use of laser energy and it has been found that such scribing processes often produce short circuit defects in the scribed region. By utilizing a conversion reagent in conjunction with the scribing laser, selective passivation can be achieved concomitant with severing or scribing of the semiconductor device.

The process of the instant invention may be better explained with reference to FIG. 3, which is a depiction of an apparatus for electrically and/or thermally activating a conversion reagent. The apparatus 34 of FIG. 3 includes a vessel 36 such as a beaker or tank containing therein a solution of the conversion reagent 38 as discussed previously. As shown in the Figure, a semiconductor device 21, generally similar to the device described with reference to FIG. 2, is disposed within the tank 36 of the apparatus 34. Also disposed in the tank 36 is a counter electrode 40. The apparatus 34 further includes a power supply 41 which is in electrical communication with both the counter electrode 40 and the semiconductor device 21. It will be noted that electrical contact is made to the substrate electrode 24 of the semiconductor device 21 so that electrical current will flow through the substrate electrode 24 and then through the defect regions 30a, 30b to the top electrode 26 of the device 21. It is this flow of electrical current which limits the activation of the conversion reagent 38 to those regions proximate the short circuit defects 30a, 30b. As mentioned hereinabove, activation may be directly accomplished by the flow of current or may be a secondary effect resultant from heating of the material of the electrode 26 by the current flow.

As will be appreciated by those skilled in the electrochemical arts, control of the conversion reaction may be achieved by control of polarity, magnitude, and duration of the electrical current provided by the power supply 41.

Figure 3:
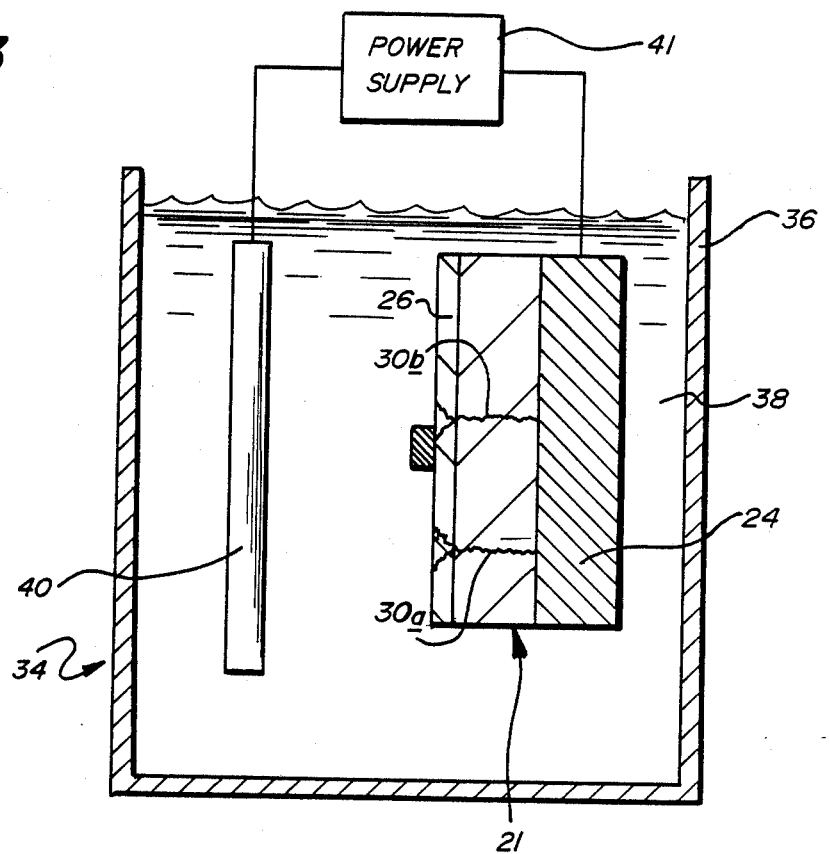
FIG. 3 is a cross-sectional view illustrating an apparatus adapted to carry out the method of the instant invention by converting the resistivity of the conductive oxide electrode of a semiconductor device.
Figure 4A:
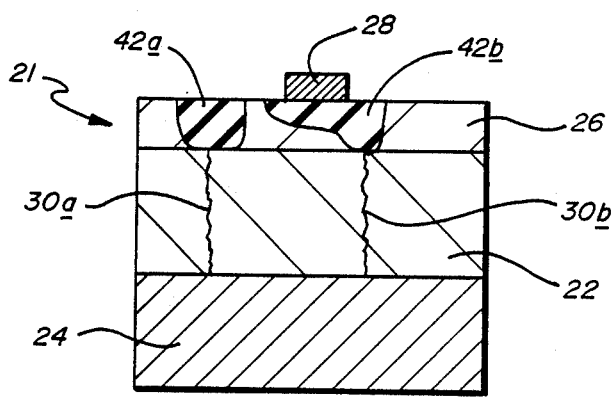
FIG. 4A is a stylized, cross-sectional view of a semiconductor device including two defect regions in the semiconductor body thereof and two corresponding portions of the superposed electrode layer thereof which portion have been subjected to the apparatus of FIG. 3 so as to increase the resistivity thereof.

FIG. 4A is a cross-sectional view of the semiconductor device 21 of FIG. 3 after passivation of the defects thereof. It will be noted that the defect regions 30a, 30b, still remain in the semiconductor body 22; however, portions 42a, 42b, of the electrically conductive material of the top electrode 26 have been converted to a high electrical resistivity form thereof. The first portion 42a is proximate the defect region 30a and the second high resistivity portion 42b is proximate the second defect region 30b.

Figure 4B:
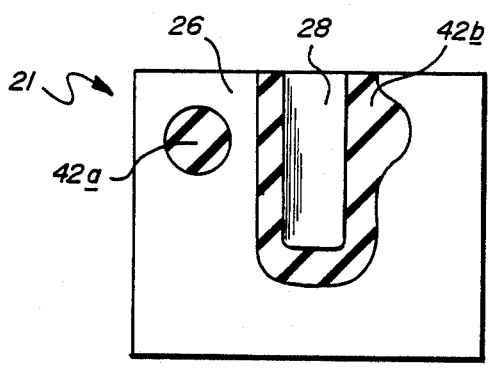
FIG. 4B is a top-plan view of the semiconductor device of FIG. 4A, illustrating more clearly the portions of the top electrode layer thereof which have been converted into high resistivity material.

FIG. 4B is a top-plan view of the same semiconductor device 21 illustrating the converted portion 42a, 42b of the top electrode 26. It will be noted that the first high resistivity portion 42a is a relatively small spot of material whereas the second portion 42b extends about the periphery of the grid member 28. This is because the grid member 28 is in relatively close proximity to the defect region 30b and, since it is a high electrical conductivity structure it serves to place a larger portion of the surface of the electrode material 26 in close electrical proximity to that defect region 30b. Thus, when the passivation process is implemented the entirety of the material forming the top electrode 26 which is proximate to the grid member 28 is electrically isolated from the remainder of that electrode material. The advantage of the instant invention in passivating defect regions which occur proximate to bus bars, grid fingers and the like should thus be readily apparent from these figures.

Figure 5A:
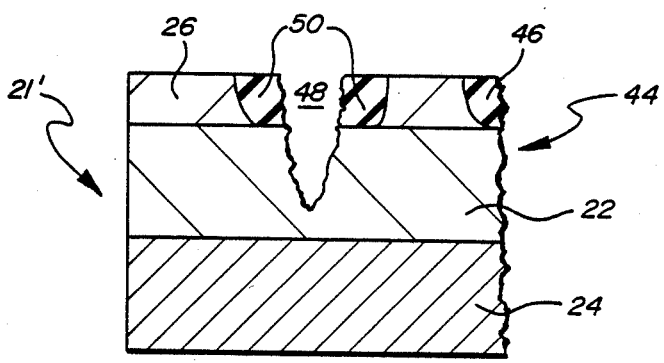
FIG. 5A is a stylized, cross-sectional view of a semiconductor device structured in accord with the principles of the instant invention and including therein a scribed region and a cut edge having short circuit defects associated therewith, and illustrating the conversion of portions of the top electrode layer to high resistivity material proximate the cut and scribed edges.
Figure 5B:
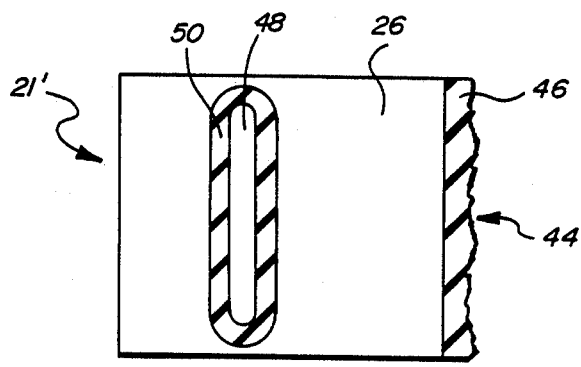
FIG. 5B is a top-plan view of the semiconductor device of FIG. 5A, illustrating the conversion of the conductive material of the top electrode layer to a high resistivity form thereof.

FIG. 5A and 5B are illustrative of the utility of the instant invention in passivating defects occasioned by the severing, scribing or inadvertent scratching of semiconductor devices during the processing thereof. FIG. 5A is a cross-sectional view of a semiconductor device 21' which is generally similar to the device 21 of the foregoing figures. Included in the semiconductor device 21' are a substrate layer 24 which provides one electrode thereof, a semiconductor body 22 and a top electrode 26 in superposed relationship with the semiconductor body 22. As illustrated, the device 21' of FIG. 5A also includes a cut edge 44, depicted by a jagged line. This edge is typical of those produced by severing semiconductor devices with mechanical shears, lasers, water jets, or other such methods. As will be readily appreciated by those skilled in the art, such a cut edge 44 frequently produces short circuit defects proximate thereto which establish a short circuit current path through the semiconductor body 22 of the device 21. It will be noted from the figure that a portion 46, of the material of the top electrode 26 proximate to the cut edge 44 has been converted to a high resistivity form so as to isolate the short circuit defect at that edge 44 from the remainder of the device.

The semiconductor device 21' of FIG. 5A also includes therein a channel 48 extending through a portion of the semiconductor body 22. This channel 48 is meant to represent a scribe line made for purposes of subdividing the device 21' as well as an inadvertent scratch occasioned during handling. Such cuts may be made by lasers, water jets or mechanical scribes whereas scratches arise through inadvertent contact of the device 21' with abrasive portions of processing apparatus and the like. Whatever the cause of the channel 48, it has been found that short circuit defects are frequently created proximate thereto, just as for a cut edge. It will be noted from the Figure that through the use of the instant invention, portions 50 of the top electrode 26 proximate to the channel 48 have been converted to a high resistivity form thereof.

Referring now to FIG. 5B, there is shown a top plan view of the same semiconductor device 21' illustrating better the passivated, high resistivity regions 46, 50 formed proximate the cut edge 44 and the channel 48.

It should be noted at this point that as mentioned previously, not all defects are manifest immediately. Latent defects may be present in semiconductor devices and not manifest themselves until the devices have operated for some time. As is known to those skilled in the art, such latent defects may be activated so as to convert them to active defects. Such activation may, for example, be by passage of an electrical current through the device. The instant invention may be utilized to passivate latent defects which have been thus activated. Activation of latent defects may be either prior to or concomitant with the defect curing procedure. Prior activation may be done when the semiconductor devices are fabricated or at any other time before passivation. Concomitant activation may be accomplished during the passivation process as for example, by the current passed through the semiconductor body to activate the conversion reagent. In some instances this current will be sufficient to activate latent defects, whereas, in other instances a higher voltage and/or amperage will need be employed. It may be desirable in some instances to tailor the voltage and/or amperage profile employed to provide an initially higher latent defect activating current followed by a relatively lower passivating current.

The advantages of the instant invention may best be appreciated and understood with reference to its use in the fabrication of photovoltaic devices. A typical production run of photovoltaic material was carried out in a roll-to-roll glow discharge deposition process whereby tandem photovoltaic cells, generally similar to those illustrated with reference to FIG. 1 were fabricated upon an elongated stainless steel substrate. The cells are comprised of two n-i-p configured triads of silicon alloy material in superposed optical and electrical series relationship and include a top $In_2O_3$ electrode thereupon. As is typical in a high volume production run, the photovoltaic cell material included a number of short circuit defects therein, which defects were passivated by the use of the instant invention.

The material is produced in the form of an elongated web of coated stainless steel of approximately one foot width and 650 feet length. The elongated web was cut into a number of slabs or segments transverse to its length. Each slab was divided into two portions, one of which was subjected to the defect passivating treatment of the instant invention while the other was untreated. The various portions of the slabs were then fabricated into photovoltaic devices and the yield of useable devices under both room light and AM-1 conditions was assessed. It should be kept in mind that, as mentioned previously, room light yield is the most stringent assessment of device quality insofar as the effect of small defects is much greater under relatively low room light illumination vis-a-vis AM-1 illumination.

The defect curing procedure of the instant invention was implemented by immersing the photovoltaic material in a conversion reagent comprised of approximately 100 grams of $AlCl_3.6H_2O$ in one liter of water. The photovoltaic material was immersed in this reagent, and a counter electrode was provided proximate thereto. The substrate of the photovoltaic material was connected to the negative terminal of a power supply, the counter electrode to the positive terminal and a forward bias of approximately 3-4 volts was passed through the photovoltaic material for approximately 2-4 seconds. This time was sufficient to convert the indium oxide electrode material to a high resistivity form proximate the defect regions. After the defect curing procedure, the slabs of photovoltaic material were further cut apart and fabricated into photovoltaic cells. The yield of cells from each of the paired slabs was measured under AM-1 illumination and under room light illumination and the percentage of acceptable cells therefrom was measured.

Referring now to FIG. 6A, there is shown a graphic depiction of the effects of the foregoing procedure upon the yield of photovoltaic cells as measured under AM-1 illumination. Nine pairs of matched slabs of photovoltaic material were evaluated. One member of each pair was subjected to the foregoing defect passivation treatment whereas the other member of the pair was untreated. It will be noted that curve A, which represents the treated material, shows a 100 percent yield of useful photovoltaic devices therefrom, whereas the yield of the untreated samples, as represented by curve B demonstrates that between 70 and 90 percent of the photovoltaic devices produced therefrom had acceptable electrical characteristics.

Referring now to FIG. 6B there is depicted a graphic representation of the room light yield of photovoltaic devices produced from the same slabs. The room light yield of photovoltaic devices is generally, significantly lower than is the AM-1 yield since photovoltaic devices are more sensitive to very small defects under low illumination. An inspection of the data of FIG. 6B shows that the defect curing procedure of the instant invention provided yields of 80-100 percent useable devices as indicated by curve C, whereas the untreated photovoltaic material produced between 30 and 82 percent useable devices, as represented by curve D. These Figures demonstrate the advantages attendant upon the use of the instant invention.

In an attempt to better understand the chemistry of the process of the instant invention, Applicants analyzed various samples of indium oxide electrode material exposed to the aluminum chloride conversion reagent. Compositional analyses were carried out on various samples of photovoltaic cell material generally similar to those of the foregoing experiment. Quantification of composition was by electron Auger measurements taken at a depth of approximately 100 Angstroms so as to avoid effects of surface contamination. The samples tested included a blank, which was not given any defect passivating treatment, a first sample (1) which was exposed to the conversion reagent for approximately 10 seconds and a second and third sample (II, III) which were exposed to the reagent for approximately one minute each. It has been found that while an exposure time of approximately 2-4 seconds with a bias of several volts is sufficient to convert oxide material proximate defects to a resistive form, longer exposures (i.e., typically in excess of 20-30 seconds) are sufficient to increase the resistivity of the entire layer of the electrode material by a factor of up to one thousand. Typical defect regions are generally less than a micron in size, consequently the high resistivity electrode material associated therewith is of a very small area. In order to obtain large area high resistivity samples for analysis, long term exposures to the conversion reagent were therefore utilized in preference to short term biased exposures.

Results of the analysis are presented in the following table.

| Element (%) | Sample | | | |
|---|---|---|---|---|
| | Blank | I | II | III |
| Cl | — | — | — | — |
| C | — | — | — | — |
| In | 39.2 | 39.2 | 39.2 | 39.2 |
| O | 61.2 | 61.2 | 61.2 | 61.2 |

It will be noted that there is no large scale change in the composition of the indium oxide material attendant upon an increase in its resistivity. It should be noted that no chlorine compounds were detected in the converted oxide material, indicating the fact that the change in conductivity is not attributable to incorporation of any of the conversion reagent species into the electrode material. Also, the absence of any carbon indicates that surface contamination is not interfering with the analysis. The most noteworthy information gained from the analysis is the fact that the indium oxide material is not etched or otherwise removed from the photovoltaic device by the treatment of the instant invention but remains present in what is essentially the same composition and thickness. This is in contradistinction to prior art conversion processes which removed or significantly altered various layers of the semiconductor device.

Figure 7:
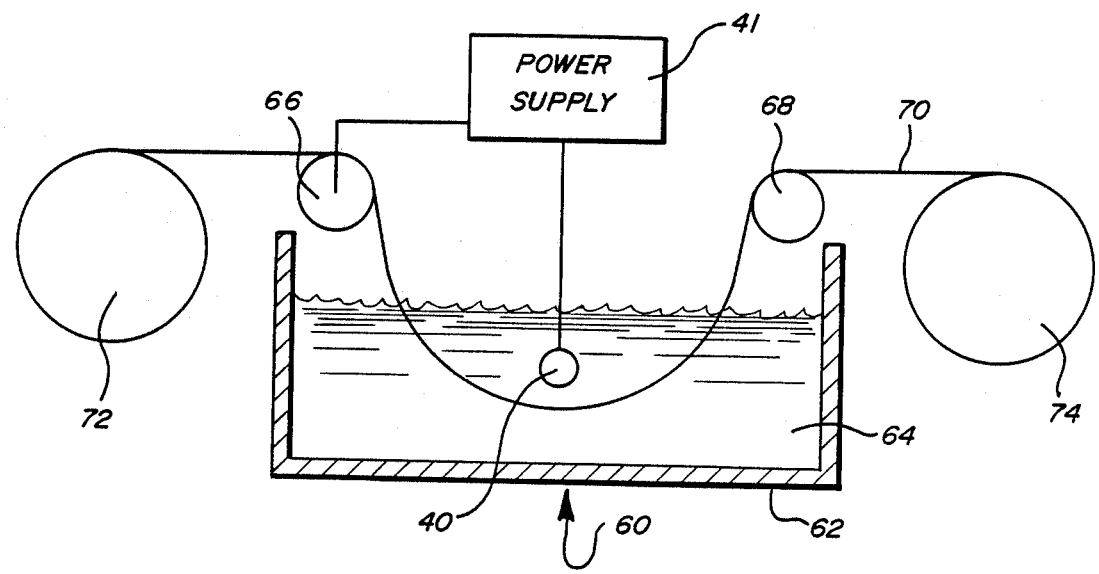

The instant invention may be readily adapted to a variety of modes of operation by one skilled in the art. For example, as depicted in FIG. 7, the instant invention may be carried out in a continuous roll-to-roll process. Referring specifically to FIG. 7, there is shown an apparatus 60 which includes a tank or vat 62 having a conversion reagent 64 contained therein. The apparatus also includes a first roller 66 and a second roller 68 adapted to direct an elongated web of substrate 70 coated with semiconductor material through the conversion reagent 64. A payoff roller 72 and a takeup roller 74 are disposed to continuously advance the coated substrate 70 through the conversion reagent 64, and the apparatus further includes a power supply 41 having a counter-electrode 40 associated with one terminal thereof. The power supply 41 establishes electrical communication with the semiconductor coated web 70 via one of the rollers, in this case the first roller 66.

In operation, the payoff 72 and takeup 74 rollers continuously advance the coated substrate 70 through the conversion reagent 64 while the power supply 41 is activated to provide a bias current through the semiconductor layer. The conversion reagent 64 passivates defects in the semiconductor material as mentioned previously.

Other variations of the instant invention will also be apparent to one of skill in the art. For example, a semiconductor coated substrate may be disposed in a vat of conversion reagent and a laser beam used to simultaneously (1) scribe or otherwise pattern the semiconductor layers and (2) passivate defects created by the scribing process, in which instance the laser energy will be utilized to activate the conversion reagent.

While the foregoing experimental series was primarily concerned with the use of an aluminum chloride reagent to passivate defects in a photovoltaic device having an indium oxide electrode, a chemist of ordinary skill in the art would be readily able to analogize these examples to other materials having similar reactivities. For example, tin oxide, zinc oxide, indium tin oxide, cadmium stannate and other such degenerate oxide semiconductor materials react chemically in a manner generally similar to indium oxide. Similarly, there are a wide variety of reagents analagous to aluminum chloride. Among such materials are those which are generally known as Lewis acids. In addition to aluminum chloride, some other members of this group include zinc chloride, tin chloride, titanium chloride, as well as other salts of amphoteric elements; all of which could be readily utilized by one of skill in the art without undue experimentation.

It should finally be noted that although the instant invention has been described primarily with reference to photovoltaic devices, it can obviously be utilized with any electronic device in which defect regions create short circuit problems. For example, the instant invention may be utilized to passivate defects in devices such as capacitors, photosensors, liquid crystal display devices, diodes, threshold switches, memory devices and various arrays and combinations thereof. It should therefor be recognized that the foregoing examples, description and discussion are merely meant to be illustrative of the principles of the instant invention and not meant to be a limitation upon the practice thereof. It is the following claims, including all equivalents, which are meant to define the scope of the instant invention.

We claim:

1. A method of passivating short circuit defects in an electronic device of the type including a thin film body having a superposed electrode comprised of a layer of transparent, electrically conductive oxide material, said method including the steps of:
   providing a conversion reagent in contact with at least those portions of the electrode proximate said defects, said reagent adapted to convert the electrically conductive electrode material to a material of higher electrical resistivity; and
   activating said conversion reagent proximate said defects so as to alter the stoichiometry of the transparent conductive oxide material to the higher resistivity form, whereby said defect regions are substantially electrically isolated from the remainder of said electrode.

2. A method as in claim 1, wherein the step of activating the conversion reagent to alter the stoichiometry of the oxide material includes changing the number of oxygen vacancies in said oxide material.

3. A method as in claim 2, wherein the step of changing the number of oxygen vacancies comprises exposing said oxide material to reducing conditions.

4. A method as in claim 2, wherein the step of changing the number of oxygen vacancies comprises exposing said oxide material to oxidizing conditions.

5. A method as in claim 1, wherein the step of activating the conversion reagent includes the further step of passing an electrical current through at least the defect regions of the thin film body and into the superposed electrode so as to activate the conversion reagent proximate thereto.

6. A method as in claim 5, including the further steps of providing a counter-electrode disposed in electrical communication with the conversion reagent and the electrode of the device; and, providing a source of electrical current in electrical communication with the semiconductor body and the counter-electrode.

7. A method as in claim 1, wherein the step of activating the conversion reagent includes the step of heating the reagent proximate said defects.

8. A method as in claim 1, wherein the step of activating the conversion reagent includes the step of illuminating the conversion reagent proximate said defects.

9. A method of passivating short circuit defects in an electronic device of the type including a thin film body having a superposed electrode comprised of a layer of electrically conductive material, said method including the steps of:
providing a conversion reagent, including therein a Lewis Acid, in contact with at least those portions of the electrode proximate said defects, said reagent adapted to convert the electrically conductive electrode material to a material of higher electrical resistivity; and
activating said conversion reagent proximate said defects so as to facilitate conversion of the electrode material to the higher resistivity form, whereby said defect regions are substantially electrically isolated from the remainder of said electrode.

10. A method of passivating short circuit defects in an electronic device of the type including a thin film body having a superposed electrode comprised of a layer of electrically conductive material, said method including the steps of:
providing a conversion reagent, including therein a salt of an amphoteric element, in contact with at least those portions of the electrode proximate said defects, said reagent adapted to convert the electrically conductive electrode material to a material of higher electrical resistivity; and
activating said conversion reagent proximate said defects so as to facilitate conversion of the electrode material to the higher resistivity form, whereby said defect regions are substantially electrically isolated from the remainder of said electrode.

11. A method as in claim 10, including the further step of selecting said salt from the group consisting essentially of: $AlCl_3$, $ZnCl_2$, $SnCl_4$, $SnCl_2$, $TiCl_4$, and combinations thereof.

12. A method as in claim 10, wherein the step of providing a conversion reagent comprises providing an aqueous conversion reagent.

13. A method as in claim 10, wherein the step of providing a conversion reagent comprises providing a reagent including a non-aqueous solvent therein.

14. A method as in claim 10, wherein the electronic device includes at least one latent defect therein, said method including the further step of: activating said at least one latent defect so as to convert it to a short circuit defect.

15. A method as in claim 14, wherein the step of activating latent defects includes passing an electrical current through said defects.

16. A method as in claim 14, wherein said latent defects are activated prior to the activation of said conversion reagent.

17. A method as in claim 14, wherein said latent defects are activated concomitant with the activation of said conversion reagent.

* * * * *